(12) United States Patent
Fujishima et al.

(10) Patent No.: US 7,419,874 B2
(45) Date of Patent: Sep. 2, 2008

(54) METHOD OF MANUFACTURING SEMICONDUCTOR DEVICE WITH CAPACITOR AND TRANSISTOR

(75) Inventors: Tatsuya Fujishima, Gunma (JP); Mikio Fukuda, Gunma (JP); Yuji Tsukada, Gunma (JP); Keiji Ogata, Gunma (JP); Izuo Iida, Tochigi (JP)

(73) Assignee: Sanyo Electric Co., Ltd., Osaka (JP)

( * ) Notice: Subject to any disclaimer, the term of this patent is extended or adjusted under 35 U.S.C. 154(b) by 360 days.

(21) Appl. No.: 11/330,402

(22) Filed: Jan. 12, 2006

(65) Prior Publication Data
US 2006/0172488 A1 Aug. 3, 2006

(30) Foreign Application Priority Data
Jan. 12, 2005 (JP) ............... 2005-005590

(51) Int. Cl.
*H01L 21/8242* (2006.01)
(52) U.S. Cl. .................. 438/251; 438/394; 257/296
(58) Field of Classification Search ......... 438/250–251, 438/393–394
See application file for complete search history.

(56) References Cited
U.S. PATENT DOCUMENTS
6,057,572 A * 5/2000 Ito et al. .................... 257/296

6,821,840 B2 * 11/2004 Wieczorek et al. .......... 438/240
6,855,595 B2 * 2/2005 Han et al. ................... 438/241
2007/0166943 A1 * 7/2007 Shin ............................ 438/393

FOREIGN PATENT DOCUMENTS
JP 2002-026261 1/2002

* cited by examiner

*Primary Examiner*—Thao X. Le
*Assistant Examiner*—Kimberly Trice
(74) *Attorney, Agent, or Firm*—Morrison & Foerster LLP (57) ABSTRACT

The invention is to prevent dielectric breakdown of a capacitor in a semiconductor device having the capacitor and a MOS transistor formed on a same semiconductor substrate. A $SiO_2$ film that is to be a gate insulation film of a high voltage MOS transistor is formed on a whole surface of a P-type semiconductor substrate. A photoresist layer is selectively formed in a high voltage MOS transistor formation region and on a part of a $SiO_2$ film covering edges of trench isolation films adjacent to a capacitor formation region, and the $SiO_2$ film is removed by etching using this photoresist layer as a mask. Since the photoresist layer functions as a mask in this etching, the edges of the trench isolation films adjacent to the capacitor are not cut too deep. The $SiO_2$ film remaining in this etching and a $SiO_2$ film to be formed thereafter form a capacitor insulation film.

8 Claims, 11 Drawing Sheets

FIG.12

METHOD OF MANUFACTURING SEMICONDUCTOR DEVICE WITH CAPACITOR AND TRANSISTOR

CROSS-REFERENCE OF THE INVENTION

This invention is based on Japanese Patent Application No. 2005-005590, the content of which is incorporated by reference in its entirety.

BACKGROUND OF THE INVENTION

1. Field of the Invention

The invention relates to a semiconductor device manufacturing method, particularly, a method of manufacturing a semiconductor device having a capacitor and a MOS transistor on a same semiconductor substrate.

2. Description of the Related Art

Conventionally, a semiconductor device having a MOS transistor and a capacitor has been known. With larger scale integration of the semiconductor device developing in recent years, a shallow trench isolation method (hereafter, called a STI method) has been broadly used for isolation of an active region, replacing a method of local oxidation of silicon (LOCOS). The STI method is to fill a shallow trench in a semiconductor substrate with an insulation material such as silicon dioxide by high-density plasma chemical vapor deposition (HDPCVD) to form a field isolation film.

Hereafter, a method of manufacturing a semiconductor device having a capacitor and a high voltage MOS transistor on a same semiconductor substrate using the conventional STI method will be described with reference to figures. FIG. 8A to 10 are cross-sectional views showing the conventional method of manufacturing the semiconductor device having the capacitor and the high voltage MOS transistor on the same semiconductor substrate, showing a capacitor formation region R4.

Figure 8A:
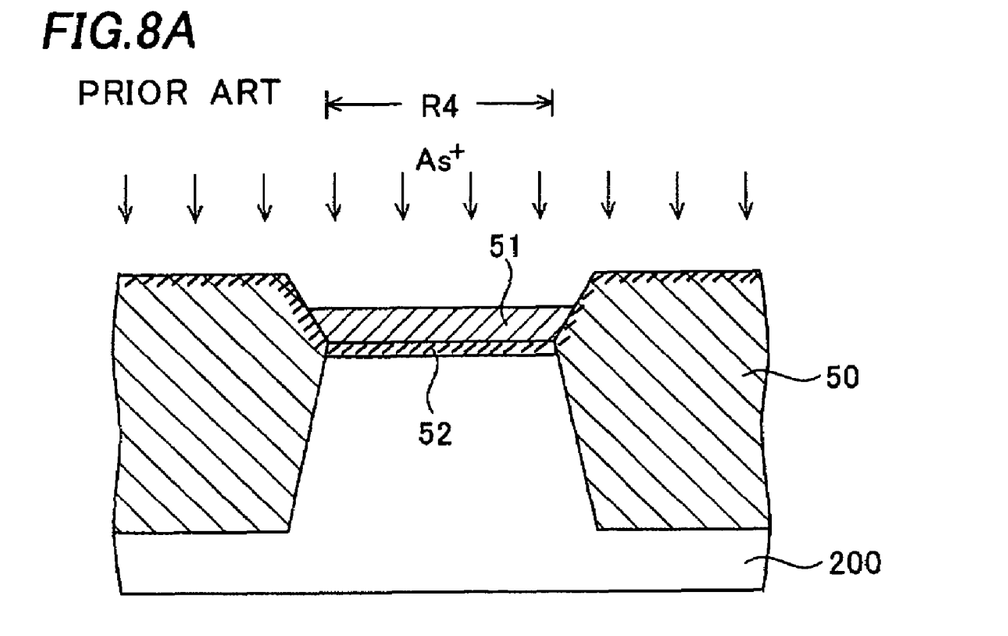

First, as shown in FIG. 8A, STI structures where trench isolation films 50 are formed on a P-type silicon substrate 200 is formed. Next, a dummy oxide film 51 (e.g. a thermal oxidation film or a TEOS film formed by a CVD method) is formed on a front surface of the P-type silicon substrate 200 near the trench isolation films 50 to have a thickness of, for example, 5 to 10 nm.

Figure 8B:
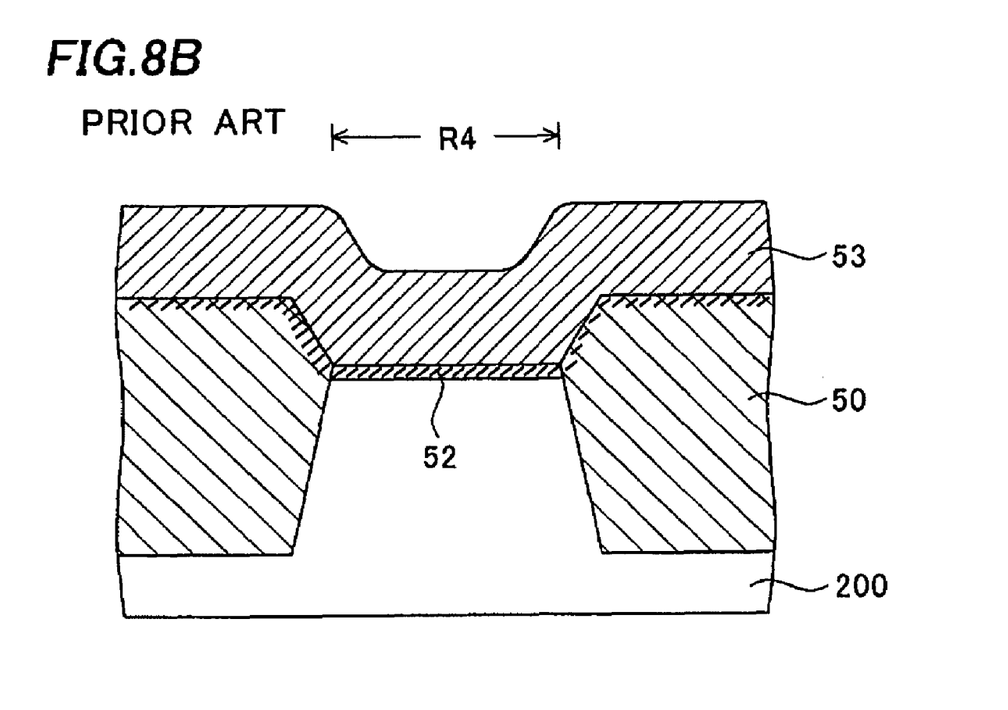

Next, a N-type impurity, for example, arsenic ion is ion-implanted in the capacitor formation region R4 to form an lower electrode layer 52 (N$^+$ layer) of the capacitor on the front surface of the P-type silicon substrate 200. Then, the dummy oxide film 51 is removed by etching, and a SiO$_2$ film 53 is formed covering the front surface of the P-type silicon substrate 200 and the trench isolation films 50, to have a thickness of 20 nm, as shown in FIG. 8B. This SiO$_2$ film 53 is to be a gate insulation film of a high voltage MOS transistor (not shown).

Figure 9A:
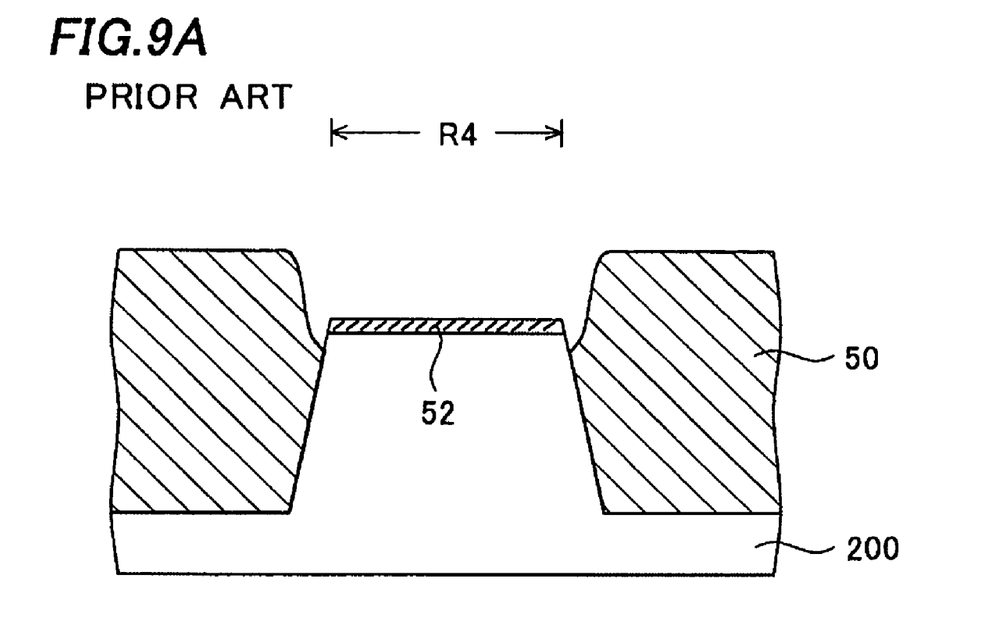
Figure 9B:
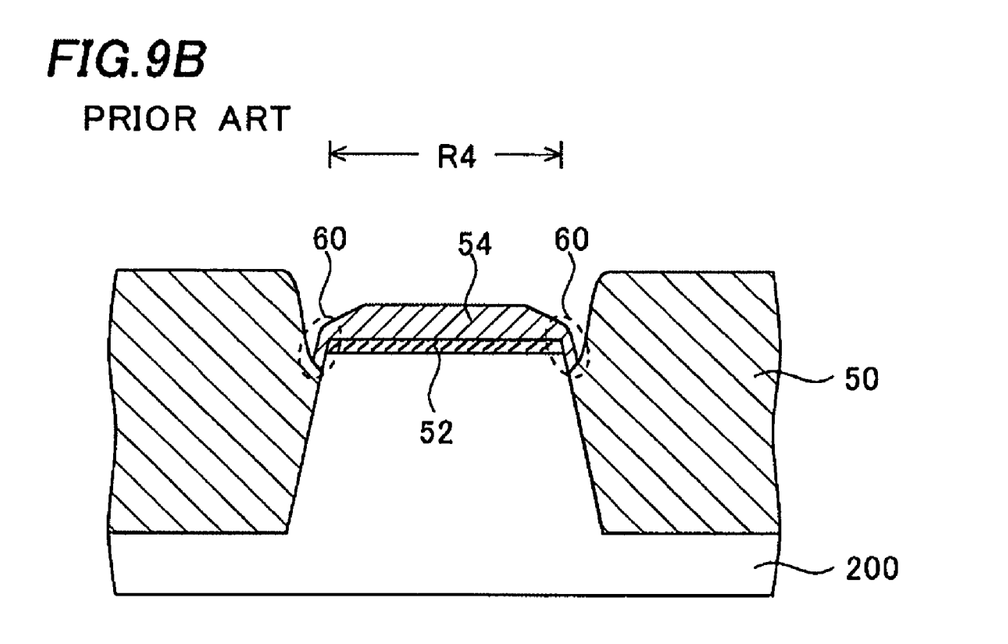

Since the SiO$_2$ film 53 is too thick to be a capacitor insulation film, the SiO$_2$ film 53 is removed by etching as shown in FIG. 9A, and then a capacitor insulation film 54 is formed by thermal oxidation to have a thickness of, for example, 7 nm, as shown in FIG. 9B.

Figure 10:
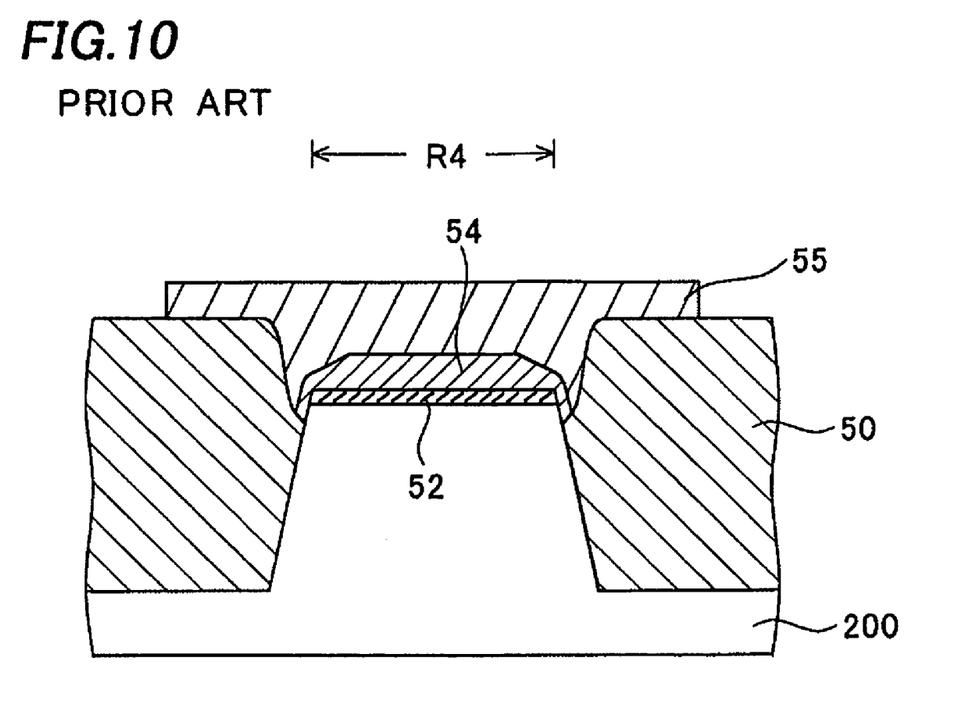

Then, an upper electrode layer 55 formed of a polysilicon layer is formed on the capacitor insulation film 54 as shown in FIG. 10. Thus, the capacitor formed of the lower electrode layer 52, the capacitor insulation film 54, and the upper electrode layer 55 is formed.

The relevant technology is described in Japanese Patent Application Publication No. 2002-26261.

With the conventional semiconductor device manufacturing method, edges of the trench isolation films 50 are cut deep when the SiO$_2$ film 53 is over-etched, as shown in FIG. 9A. This is because the impurity ion is implanted in the trench isolation film 50 during the ion implantation and its etching rate is higher than that without ion implantation.

Furthermore, since the impurity ion is implanted in the front surface of the P-type silicon substrate 200 in the ion implantation, accelerated oxidation occurs when the capacitor insulation film 54 is formed. Therefore, as shown in FIG. 9B, the thickness of the capacitor insulation film 54 becomes thinner at an edge portion 60 in a corner of the lower electrode layer 52.

Therefore, even if the upper electrode layer 55 is formed to form the capacitor, as shown in FIG. 10, as described above, since the thickness of the capacitor insulation film 54 has a thin portion and its thickness is uneven, there is problems that electric field concentration occurs, dielectric breakdown of the capacitor insulation film 54 easily occurs at this portion, and the life of the capacitor is short.

SUMMARY OF THE INVENTION

The invention provides a method of manufacturing a semiconductor device having a capacitor and a MOS transistor on a front surface of a same semiconductor substrate. The method includes forming element isolation films on the substrate to define a capacitor formation region and a transistor formation region, implanting impurity ions into the capacitor formation region to form a lower electrode layer, forming a first insulation film to cover the element isolation films, the capacitor formation region and the transistor formation region, forming a patterned photoresist layer on the first insulation film to cover an edge of one of the element isolation films defining the capacitor formation region and to cover the transistor formation region, etching the first insulation film using the patterned photoresist layer as a mask to expose the lower electrode layer, forming a second insulation film on the capacitor formation region so that the second insulation film and the first insulation film covering the edge of the one of the element isolation films form a capacitor insulation film, and forming a gate electrode on the first insulation film of the transistor formation region and an upper electrode layer on the capacitor insulation film.

The invention also provides another method of manufacturing a semiconductor device comprising a capacitor and a MOS transistor on a front surface of a same semiconductor substrate. The method includes forming element isolation films on the substrate to define a capacitor formation region and a transistor formation region, forming a photoresist layer on the substrate having an opening in the capacitor formation region and covering one of the element isolation films defining the capacitor formation region, implanting impurity ions into the capacitor formation region through the opening using the photoresist layer as a mask to form a lower electrode layer, forming a first insulation film to cover the implanted capacitor formation region, the transistor formation region and the element isolation films, etching the first insulation film on the capacitor formation region to expose the lower electrode layer, forming a second insulation film on the capacitor formation region as a capacitor insulation film, and forming a gate electrode on the first insulation film of the transistor formation region and an upper electrode layer on the capacitor insulation film.

BRIEF DESCRIPTION OF THE DRAWINGS

FIGS. 1A to 4C are cross-sectional views explaining a method of manufacturing a semiconductor device of a first embodiment of the invention.

FIGS. 5A to 7C are cross-sectional views explaining a method of manufacturing a semiconductor device of a second embodiment of the invention.

FIGS. 8A to 10 are cross-sectional views explaining a conventional method of manufacturing a semiconductor device.

DETAILED DESCRIPTION OF THE INVENTION

A method of manufacturing a semiconductor device of a first embodiment of the invention will be described referring to figures.

Figure 1A:
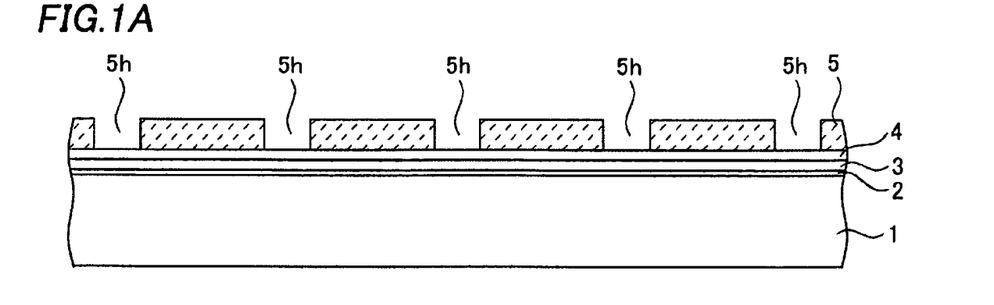

As shown in FIG. 1A, a $SiO_2$ film 2 (silicon dioxide film) is formed on a front surface of a P-type silicon substrate 1 by thermal oxidation. Then, a polysilicon film 3 having a thickness of about 50 nm and a $Si_3N_4$ film 4 (silicon nitride film) having a thickness of 120 nm are formed on the $SiO_2$ film 2 by a CVD method. Furthermore, a photoresist layer 5 having a plurality of openings 5h is formed on the $Si_3N_4$ film 4.

Figure 1B:
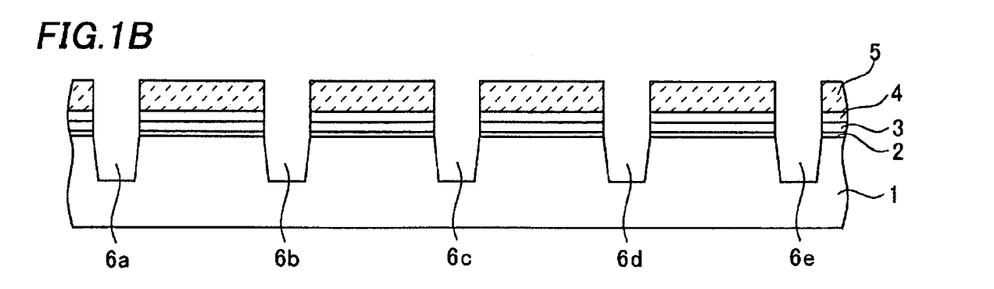

Next, as shown in FIG. 1B, the $Si_3N_4$ film 4, the polysilicon film 3, and the $SiO_2$ film 2 exposed in the openings 5h are etched in this order using the photoresist layer 5 having the plurality of openings 5h as a mask, and the front surface of the P-type silicon substrate 1 is further etched to form trenches 6a, 6b, 6c, 6d, and 6e. The depth of the trench 6 is preferably 1 μm.

Figure 1C:
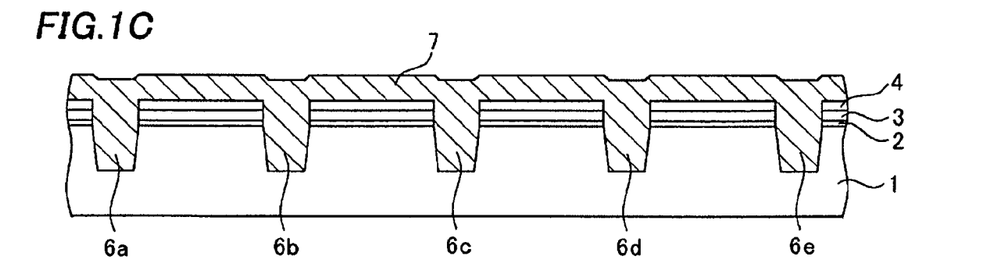
Figure 1D:
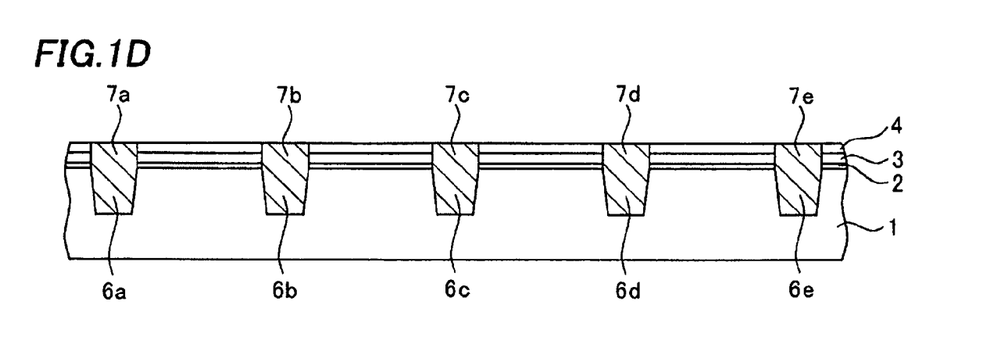

Next, as shown in FIG. 1C, a $SiO_2$ film 7 (HDPCVD film) is deposited on the whole surface including in the trenches 6a, 6b, 6c, 6d, and 6e by, for example, by a HDPCVD method. Then, as shown in FIG. 1D, the front surface of the $SiO_2$ film 7 is polished by a CMP method (Chemical Mechanical Polishing Method). At this time, the $Si_3N_4$ film 4 functions as a CMP stop detection film, and the CMP is stopped when the $Si_3N_4$ film 4 is detected being exposed by an optical method. In this manner, trench isolation films 7a, 7b, 7c, 7d, and 7e each selectively embedded in the trenches 6a, 6b, 6c, 6d, and 6e are formed as element isolation films.

Figure 2A:
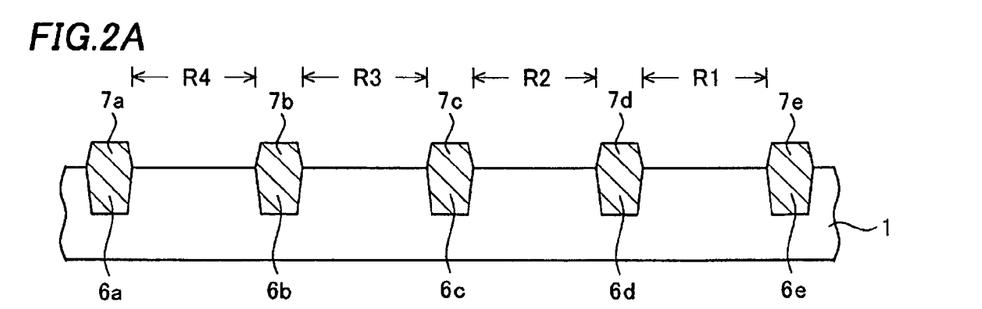

Then, as shown in FIG. 2A, the $Si_3N_4$ film 4 is removed using chemicals such as hot phosphoric acid, the polysilicon film 3 is removed by dry-etching, and further the $SiO_2$ film 2 is removed by etching according to needs. A STI structure suitable for miniaturization as an element separation structure is thus formed. At this time, in FIG. 2A, R1 denotes a high voltage MOS transistor formation region, R2 denotes a medium voltage MOS transistor formation region, R3 denotes a low voltage MOS transistor formation region, and R4 denotes a capacitor formation region. These regions R1, R2, R3, and R4 are insulated from each other with the adjacent trench isolation films 7a, 7b, 7c, 7d, and 7e.

Figure 2B:
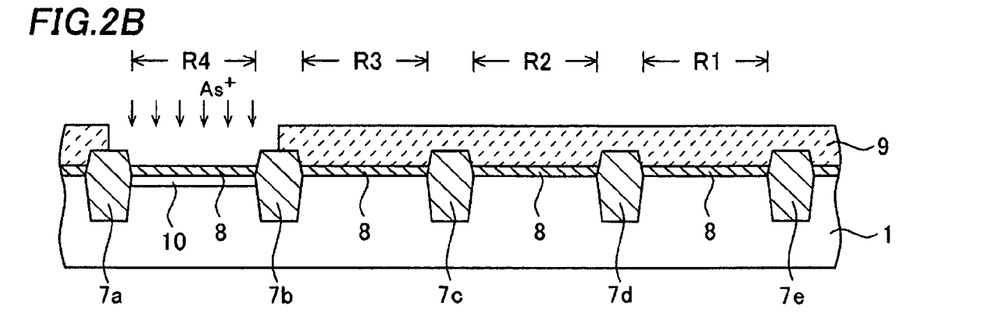

Next, as shown in FIG. 2B, a dummy oxide film 8 (e.g. a thermal oxidation film or a TEOS film formed by a CVD method) is formed on the front surface of the P-type silicon substrate 1 formed with the trench isolation films 7a, 7b, 7c, 7d, and 7e in each of the regions R1, R2, R3, and R4 adjacent to each of the trench isolation films 7a, 7b, 7c, 7d, and 7e to have a thickness of, for example, 5 to 10 nm.

Then, as shown in FIG. 2B, a photoresist layer 9 is selectively formed on the dummy oxide film 8 in the regions R1, R2, and R3 other than the capacitor formation region R4 by exposure and development treatment, and a N-type impurity, for example, arsenic ion is ion-implanted to the capacitor formation region R4 using this photoresist layer 9 as a mask under a condition of an acceleration voltage 70 KeV and a dose $2\times10^{14}/cm^2$ to form a lower electrode layer 10 ($N^+$ layer) of the capacitor. At this time, the dummy oxide film 8 has a function of reducing damage of the silicon substrate 1 due to the ion implantation.

Figure 2C:
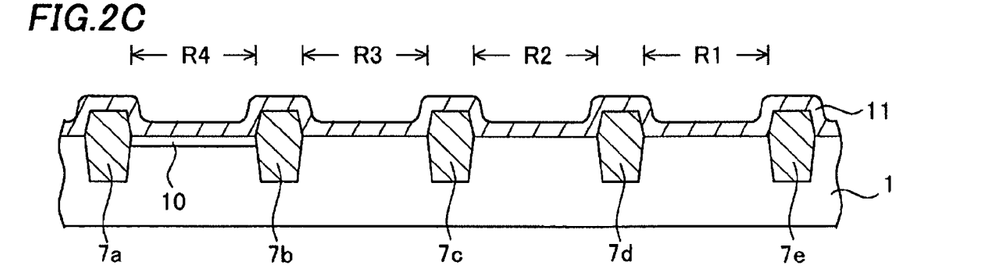

Next, after the photoresist layer 9 is removed, the dummy oxide film 8 is removed by etching to expose the front surface of the P-type silicon substrate 1. Then, as shown in FIG. 2C, a $SiO_2$ film 11 (e.g. a thermal oxidation film or a HTO film formed by a CVD method) is formed covering the front surface of the P-type silicon substrate 1 in each of the regions R1, R2, R3, and R4 and the trench isolation films 7a, 7b, 7c, 7d, and 7e, to have a thickness of, for example, 20 nm.

Figure 2D:
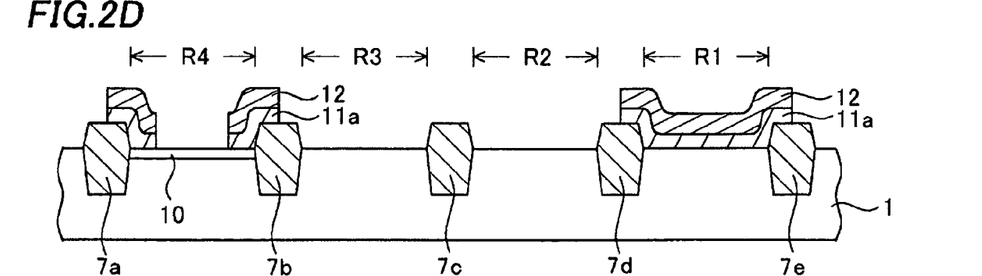

Next, as shown in FIG. 2D, a photoresist layer 12 is selectively formed on a $SiO_2$ film 11a in the high voltage MOS transistor formation region R1 and on a part of the $SiO_2$ film 11a covering edges of the trench isolation films 7a and 7b in the capacitor formation region R4 by exposure and development treatment. Then, the $SiO_2$ film 11 is removed by etching using this photoresist layer 12 as a mask.

The edges of the trench isolation films 7a and 7b adjacent to the capacitor formation region R4 are not etched since the photoresist layer 12 serves as a mask. This prevents trouble that the edges of the trench isolation films 7a and 7b are cut too deep as has been seen in the conventional art.

At this time, the $SiO_2$ film 11a remaining in the high voltage MOS transistor formation region R1 is to be a gate insulation film 11a (thickness T1=20 nm) of the high voltage MOS transistor. It is noted that actually the gate insulation film (11a+11b+11c) of the high voltage MOS transistor is formed by further forming a $SiO_2$ film 11b and a $SiO_2$ film 11c which will be described below.

Figure 3A:
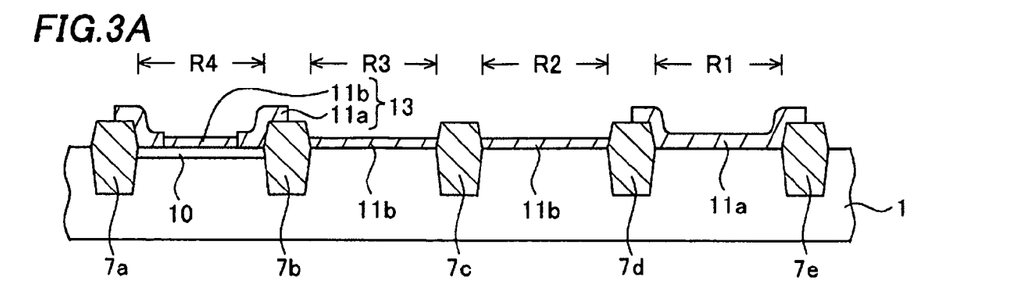

Next, as shown in FIG. 3A, after the photoresist layer 12 is removed, the P-type silicon substrate 1 is thermally oxidized to form a $SiO_2$ film 11b in the capacitor formation region R4, the medium voltage MOS transistor formation region R2, and the low voltage MOS transistor formation region R3, which is thinner than the gate insulation film 11a of the high voltage MOS transistor, for example, 7 nm. At this time, the $SiO_2$ film 11a (thickness T1=20 nm) and the $SiO_2$ film 11b (thickness T2=7 nm) formed covering the edges of the trench isolation films 7a and 7b in the capacitor formation region R4 are to be a capacitor insulation film 13 as a whole.

It is noted that actually the capacitor insulation film (11a+11b+11c, 11b+11c) is formed by further layering a $SiO_2$ film 11c which will be described below. Furthermore, the $SiO_2$ film 11b formed in the medium voltage MOS transistor formation region R2 is to be a gate insulation film 11b (thickness T2=7 nm) of the medium voltage MOS transistor as it is. It is noted that actually the gate insulation film (11b+11c) of the medium voltage MOS transistor is formed by further layering a $SiO_2$ film 11c which will be descried below.

Figure 3B:
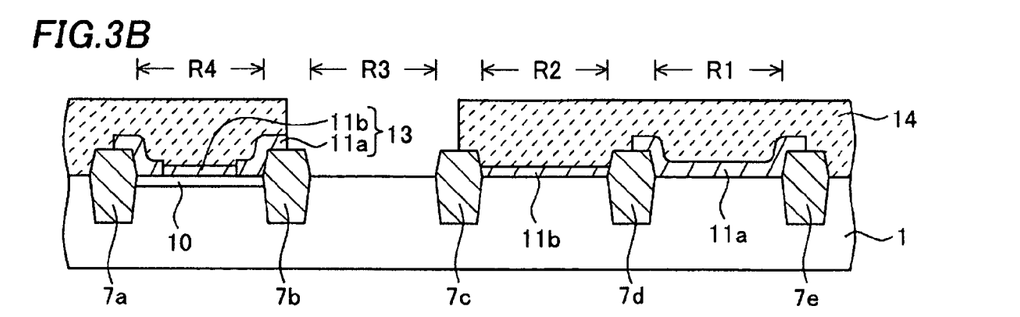

Next, as shown in FIG. 3B, the capacitor formation region R4, the high voltage MOS transistor formation region R1, and the medium voltage MOS transistor formation region R2 are covered with a photoresist layer 14, and the $SiO_2$ film 11b in the low voltage MOS transistor formation region R3 is removed by etching to expose the P-type silicon substrate 1.

Figure 3C:
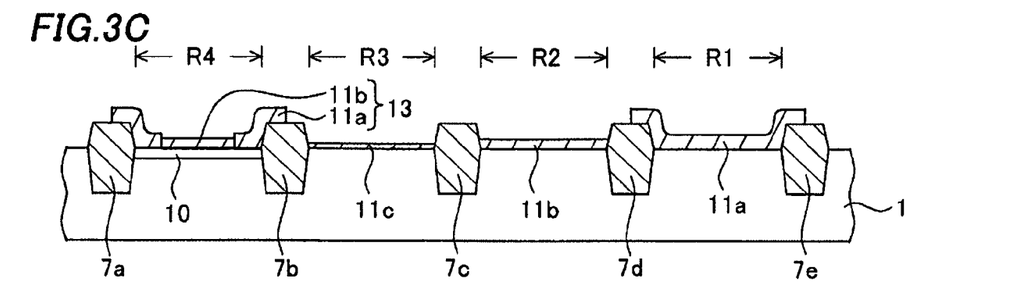

Next, as shown in FIG. 3C, after the photoresist layer 14 is removed, the silicon substrate 1 is thermally oxidized to form a $SiO_2$ film 11c in the low voltage MOS transistor formation region R3, which is thinner than the gate insulation film 11b of the medium voltage MOS transistor, for example, 3 nm. This is to be a gate insulation film 11c (thickness 3 nm) of the low voltage MOS transistor.

Figure 3D:
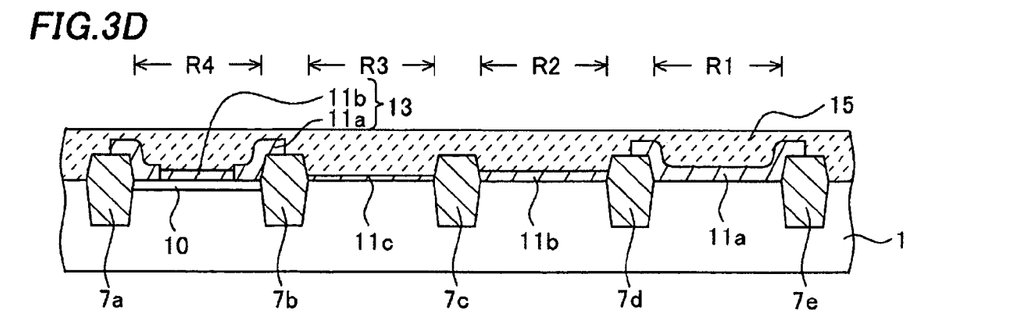
Figure 4A:
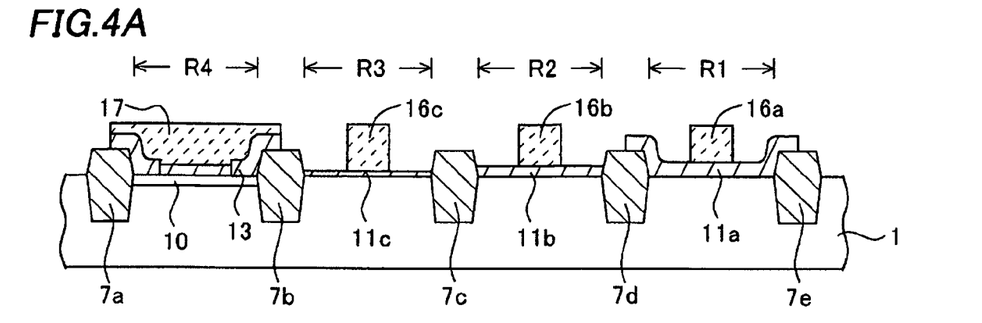

Next, as shown in FIG. 3D, a polysilicon film 15 having a thickness of about 200 nm is formed on the whole surface of the silicon substrate 1. Then, as shown in FIG. 4A, a gate electrode 16a, a gate electrode 16b, a gate electrode 16c, and an upper electrode layer 17 are respectively formed on the gate insulation film 11a of the high voltage MOS transistor, the gate insulation film 11b of the medium voltage MOS transistor, the gate insulation film 11c of the low voltage MOS transistor, and the capacitor insulation film 13, using a photoresist layer (not shown) formed on the polysilicon film 15 as a mask.

Figure 4B:
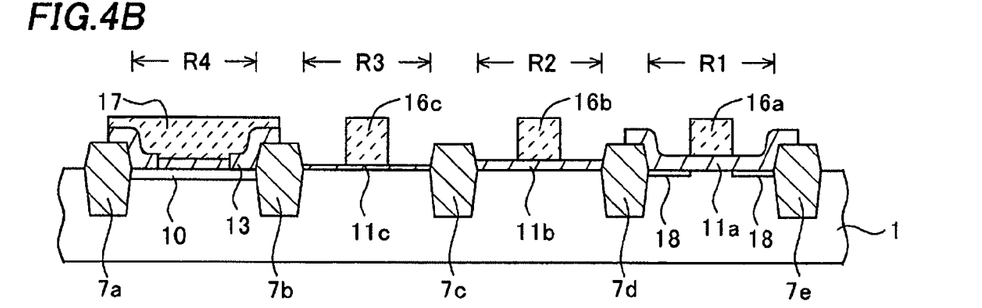

Next, as shown in FIG. 4B, a N-type impurity, for example, phosphorus ion is ion-implanted to an ion implantation layer formation region of the high voltage MOS transistor using a photoresist layer (not shown) having an opening as a mask under a condition of an acceleration voltage 30 KeV and a dose $3\times10^{12}/cm^2$. Thus, an ion implantation layer 18 ($N^-$ layer) is formed in the source and drain regions of the high voltage MOS transistor in the high voltage MOS transistor formation region R1. Next, a spacer film 40 is formed on the sidewall of the gate electrode 16a. This spacer film 40 can be formed by depositing an oxide film by, for example, the CVD method and then etching back this oxide film.

Figure 4C:
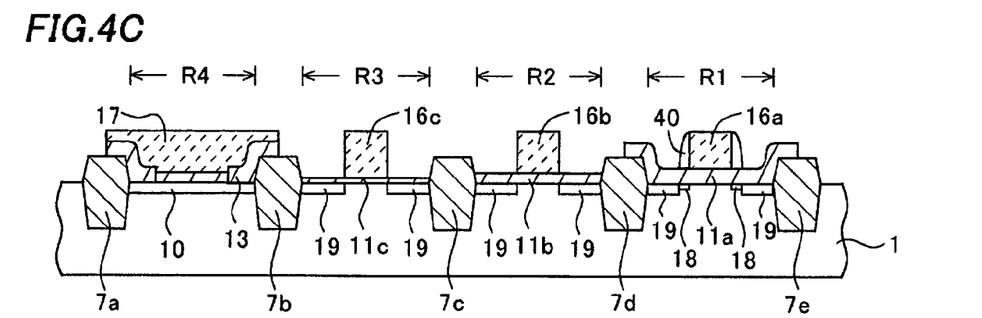

Next, as shown in FIG. 4C, a N-type impurity, for example, arsenic ion is ion-implanted in the ion implantation layer formation region of the MOS transistor in each of the regions R1, R2, and R3 using spacer films 40 and a photoresist layer (not shown) having openings as a mask under a condition of an acceleration voltage 60 KeV and a dose $2\times10^{15}/cm^2$. Thus, an ion implantation layer 19 ($N^+$ layer) is formed in the source and drain regions of the MOS transistor in each of the regions R1, R2, and R3.

Figure 11:
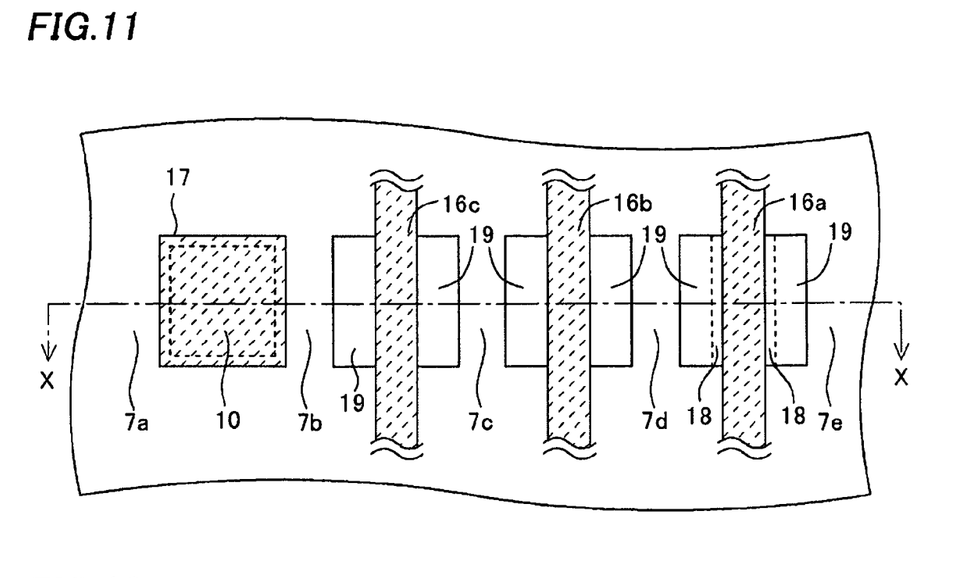
FIG. 11 is a plan views explaining the method of manufacturing the semiconductor device of the first embodiment of the invention.

Thus, the capacitor, the high voltage MOS transistor, the medium voltage MOS transistor, and the low voltage MOS transistor are respectively formed in the capacitor formation region R4, the high voltage MOS transistor formation region R1, the medium voltage MOS transistor formation region R2, and the low voltage MOS transistor formation region R3. It is noted that FIG. 11 is a top plan view of the semiconductor device shown in FIG. 4C, and FIG. 4C is a cross-sectional view along line X-X of FIG. 11. The capacitor insulation film 13 and the gate insulation films 11a, 11b, and 11c are omitted in FIG. 11 as a matter of convenience.

In the first embodiment described above, the edges of the trench isolation films 7a and 7b adjacent to the capacitor formation region R4 are not cut undesirably deep when the $SiO_2$ film 11 is etched, unlike in the conventional art, since the photoresist layer 12 serves as a mask. As a result, the capacitor insulation film 13 with high film quality can be formed, preventing electric field concentration and dielectric breakdown of the capacitor.

Figure 5A:
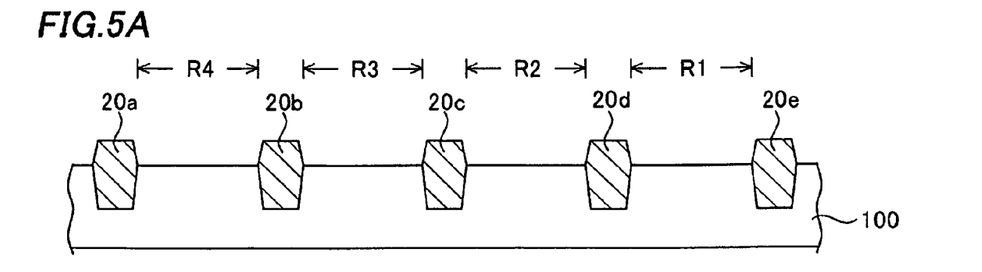

Next, a method of manufacturing a semiconductor device of a second embodiment of the invention will be described referring to figures. As shown in FIG. 5A, a STI structure where trench isolation films 20a, 20b, 20c, 20d, and 20e are formed on a P-type silicon substrate 100 by the same method of manufacturing the semiconductor device as that of the first embodiment.

Figure 5B:
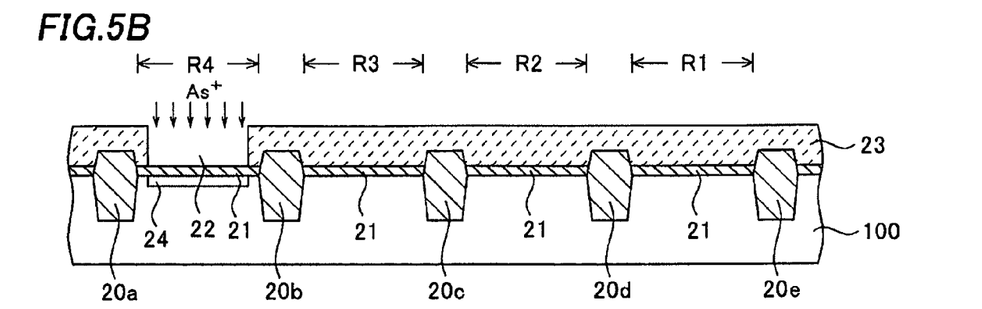

Next, as shown in FIG. 5B, a dummy oxide film 21 (e.g. a thermal oxidation film or a TEOS film formed by a CVD method) is formed on the front surface of the P-type silicon substrate 100 in each of the regions R1, R2, R3, and R4 adjacent to the trench isolation films 20a, 20b, 20c, 20d, and 20e to have a thickness of, for example, 5 to 10 nm.

Then, a photoresist layer 23 is selectively formed on the dummy oxide film 21 and on the trench isolation films 20a, 20b, 20c, 20d, and 20e, covering the edges of the trench isolation films 20a and 20b adjacent to the capacitor formation region R4 by exposure and development treatment, to form an opening 22 in the capacitor formation region.

Next, a N-type impurity, for example, arsenic ion is ion-implanted in the opening 22 using this photoresist layer 23 as a mask under a condition of an acceleration voltage 70 KeV and a dose $2\times10^{14}/cm^2$ to form a lower electrode layer 24 ($N^+$ layer) of the capacitor. At this time, since the trench isolation films 20a and 20b adjacent to the capacitor formation region R4 are covered with the photoresist layer 23, the impurity ion is not implanted in the trench isolation films 20a and 20b. It is noted that the dummy oxide film 21 has a function of reducing damage of the silicon substrate 100 due to the ion implantation.

Figure 5C:
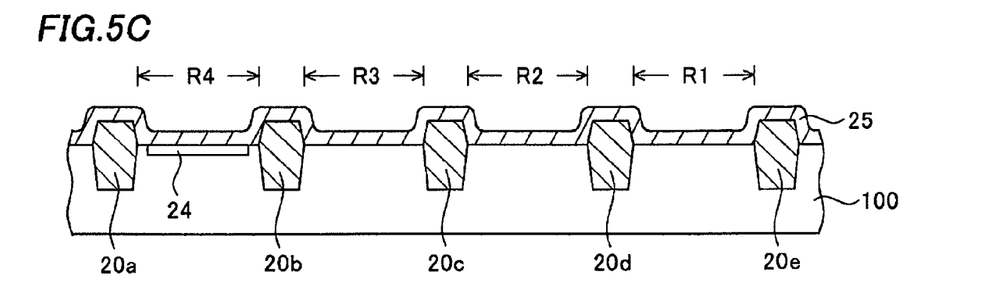

Next, the photoresist layer 23 is removed, and then the dummy oxide film 21 is removed by etching to expose the front surface of the P-type silicon substrate 100. Then, as shown in FIG. 5C, a $SiO_2$ film 25 (e.g. a thermal oxidation film or a HTO film formed by a CVD method) is formed covering the front surface of the P-type silicon substrate 100 and the trench isolation films 20a, 20b, 20c, 20d, and 20e, to have a thickness of 20 nm.

Figure 5D:
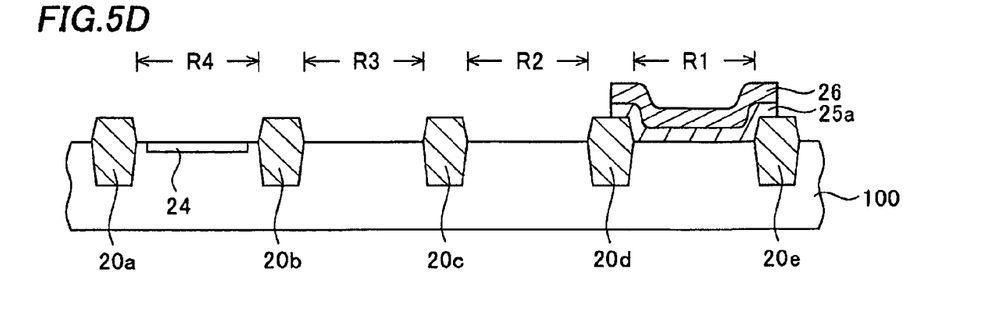

Next, as shown in FIG. 5D, a photoresist layer 26 is selectively formed on the $SiO_2$ film 25 in the high voltage MOS transistor formation region R1 by exposure and development treatment. Then, the $SiO_2$ film 25 is removed by etching using this photoresist layer 26 as a mask. At this time, the $SiO_2$ film 25 remaining in the high voltage MOS transistor formation region R1 is to be a gate insulation film 25a (thickness T1=20 nm) of the high voltage MOS transistor. It is noted that actually the gate insulation film (25a+25b+25c) of the high voltage MOS transistor is formed by further forming a $SiO_2$ film 25b and a $SiO_2$ film 25c which will be described below.

At this time, since an impurity is not implanted in the trench isolation films 20a and 20b adjacent to the capacitor formation region R4 by the ion-implantation as described above, its etching rate is low and the edges of the trench isolation films 20a and 20b are not cut deep even if etched.

Figure 6A:
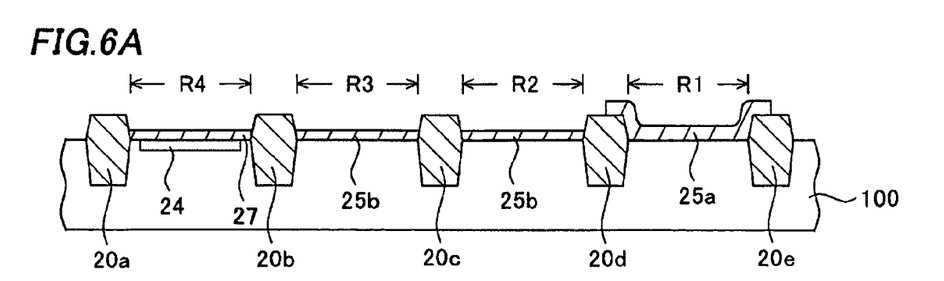

Next, as shown in FIG. 6A, after the photoresist layer 26 is removed, the P-type silicon substrate 100 is thermally oxidized to form a $SiO_2$ film 25b in the capacitor formation region R4, the medium voltage MOS transistor formation region R2, and the low voltage MOS transistor formation region R3, which is thinner than the gate insulation film 25a of the high voltage MOS transistor, for example, 7 nm. At this time, the $SiO_2$ film 25b formed in the capacitor formation region R4 is to be a capacitor insulation film 27 (thickness T2=7 nm) as it is.

It is noted that actually the capacitor insulation film (27+25c) is formed by further forming a $SiO_2$ film 25c which will be described below. Furthermore, the $SiO_2$ film 25b formed in the medium voltage MOS transistor formation region R2 is to be a gate insulation film 25b (thickness T2=7 nm) of the medium voltage MOS transistor as it is. It is noted that actually the gate insulation film (25b+25c) of the medium voltage MOS transistor is formed by further layering a $SiO_2$ film 25c which will be described below.

Figure 6B:
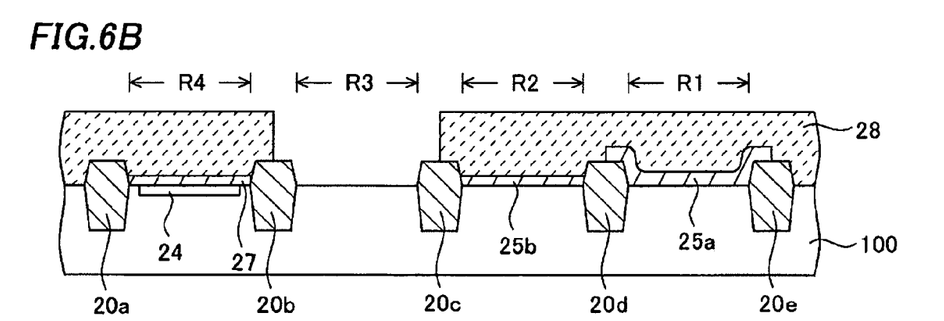

Next, as shown in FIG. 6B, the high voltage MOS transistor formation region R1, the medium voltage MOS transistor formation region R2, and the capacitor formation region R4 are covered with a photoresist layer 28, and the $SiO_2$ film 25b in the low voltage MOS transistor formation region R3 is removed by etching to expose the P-type silicon substrate 100.

Figure 6C:
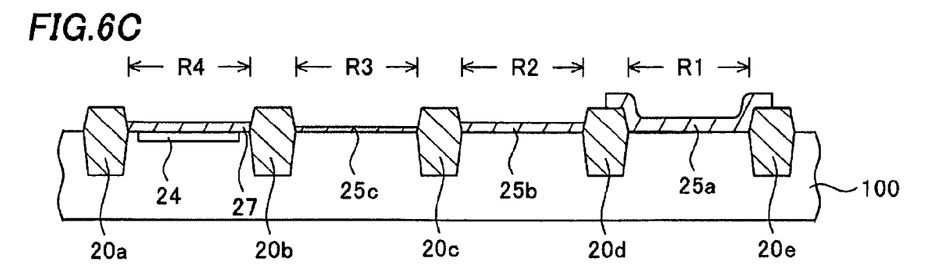

Next, as shown in FIG. 6C, after the photoresist layer 28 is removed, the P-type silicon substrate 100 is thermally oxidized to form a $SiO_2$ film 25c in the low voltage MOS transistor formation region R3, which is thinner than the gate insulation film 25b of the medium voltage MOS transistor, for example, 3 nm. This is to be a gate insulation film 25c (thickness 3 nm) of the low voltage MOS transistor.

Figure 6D:
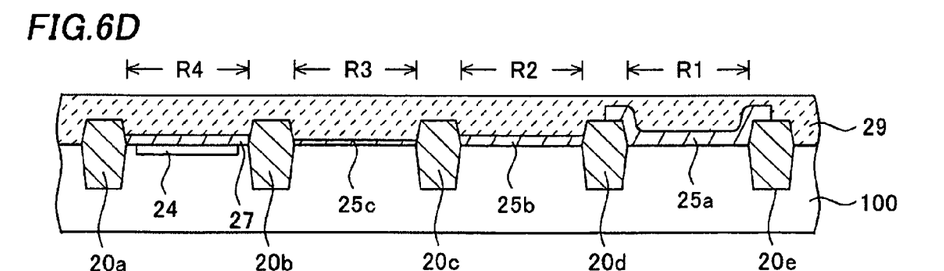
Figure 7A:
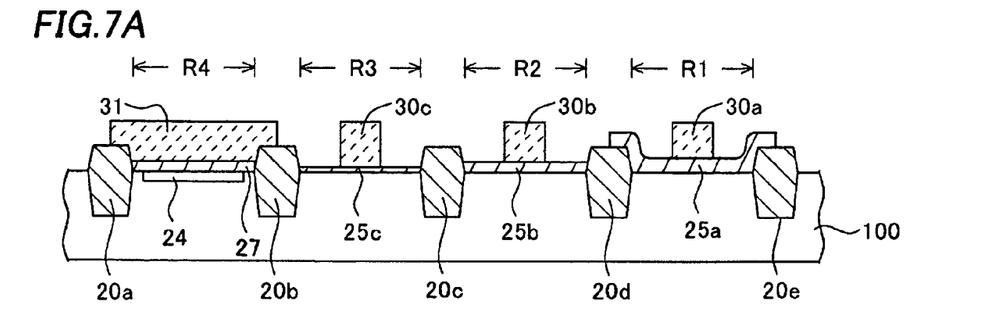

Next, as shown in FIG. 6D, a polysilicon film 29 having a thickness of 200 nm is formed on the whole surface of the P-type silicon substrate 100. Then, using a photoresist layer (not shown) formed on the polysilicon film 29 as a mask, as shown in FIG. 7A, a gate electrode 30a, a gate electrode 30b, a gate electrode 30c, and an upper electrode layer 31 are respectively formed on the gate insulation film 25a of the high voltage MOS transistor, the gate insulation film 25b of the medium voltage MOS transistor, the gate insulation film 25c of the low voltage MOS transistor, and the capacitor insulation film 27.

Figure 7B:
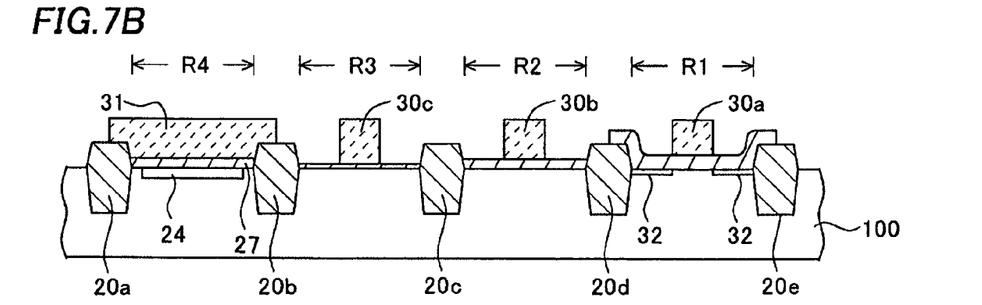

Next, as shown in FIG. 7B, a N-type impurity, for example, phosphorus ion is ion-implanted in the ion implantation layer formation region of the high voltage MOS transistor using a photoresist layer (not shown) having openings as a mask under a condition of an acceleration voltage 30 KeV and a dose $3\times10^{12}/cm^2$. Thus, an ion implantation layer 32 ($N^-$ layer) is formed in the source and drain regions of the high voltage MOS transistor in the high voltage MOS transistor formation region R1. Next, a spacer film 45 is formed on the sidewall of the gate electrode 16a. This spacer film 45 can be formed by depositing an oxide film by, for example, the CVD method and then etching back this oxide film.

Figure 7C:
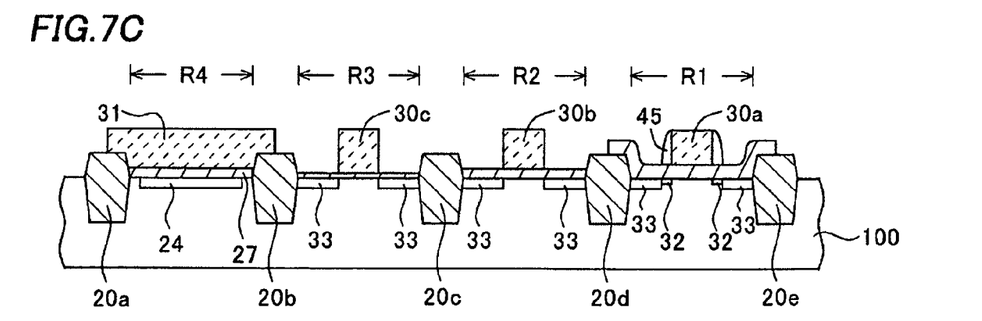

Next, as shown in FIG. 7C, a N-type impurity, for example, arsenic ion is ion-implanted in the ion implantation layer formation region of the MOS transistor in each of the regions R1, R2, and R3 using spacer films 45 and a photoresist layer (not shown) having openings as mask under a condition of an acceleration voltage 60 KeV and a dose $2\times10^{15}/cm^2$. Thus, an ion implantation layer 33 ($N^+$ layer) is formed in the source and drain regions of the MOS transistor in each of the regions R1, R2, and R3.

Figure 12:
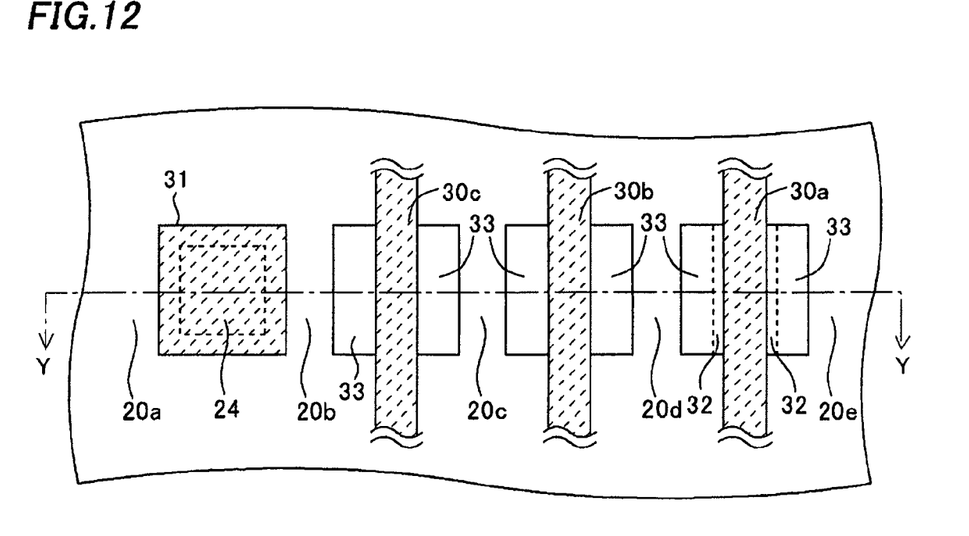
FIG. 12 is a plan views explaining the method of manufacturing the semiconductor device of the second embodiment of the invention.

Thus, the capacitor, the high voltage MOS transistor, the medium voltage MOS transistor, and the low voltage MOS transistor are respectively formed in the capacitor formation region R4, the high voltage MOS transistor formation region R1, the medium voltage MOS transistor formation region R2, and the low voltage MOS transistor formation region R3. In this second embodiment, since the lower electrode layer 24 is formed by ion implantation using the photoresist layer 23 as a mask, its area is smaller than that of the lower electrode layer 10 of the first embodiment, and a capacitance of the capacitor can be reduced by the reduced amount. Therefore, it is necessary to take it into account when designing. It is noted that FIG. 12 is a top plan view of the semiconductor device shown in FIG. 7C, and FIG. 7C is a cross-sectional view along line Y-Y of FIG. 12. The capacitor insulation film 27 and the gate insulation films 25a, 25b, and 25c are omitted in FIG. 12 as a matter of convenience.

As described above, in the second embodiment, since the photoresist layer 23 serves as a mask, the impurity ion is not implanted in the trench isolation films 20a and 20b adjacent to the capacitor, so that the edges of the trench isolation films 20a and 20b are not cut too deep when the $SiO_2$ film 25 is etched. As a result, the capacitor insulation film 27 with high film quality is formed, preventing electric field concentration and dielectric breakdown of the capacitor.

Although an example of applying the invention to the method of manufacturing the semiconductor device formed of the P-type silicon substrate is introduced in the first and second embodiments of the invention, the invention can be applied to a method of manufacturing a semiconductor device formed of a N-type silicon substrate. In this case, ion implantation for forming the lower electrode layer 24 is performed with boron ion under a condition of an acceleration voltage 15 KeV and a dose $2\times10^{14}/cm^2$.

Furthermore, although the gate insulation film and the capacitor insulation film of each of the transistors are formed by thermal oxidation in the first and second embodiments of the invention, the invention is not limited to this and those can be formed by a CVD (chemical vapor deposition) method or a PVD (physical vapor deposition) method.

Furthermore, although the description is made on the example that only the high voltage MOS transistor has the source and drain regions having the LDD (Lightly Doped Drain) structure in the first and second embodiments of the invention, the low voltage or medium voltage MOS transistor can employ the LDD structure, too.

Furthermore, although the description is made on the method of manufacturing the semiconductor device having the capacitor and three types of MOS transistors having the gate insulation films of different thicknesses formed on the same semiconductor substrate in the first and second embodiments of the invention, the invention is not limited to this and also can be applied to the method of manufacturing the semiconductor device having the capacitor and at least one MOS transistor formed on the same semiconductor substrate.

What is claimed is:

1. A method of manufacturing a semiconductor device comprising a capacitor and a MOS transistor on a front surface of a same semiconductor substrate, the method comprising:

forming element isolation films on the substrate to define a capacitor formation region and a transistor formation region;

implanting impurity ions into the capacitor formation region to form a lower electrode layer;

forming a first insulation film to cover the element isolation films, the capacitor formation region and the transistor formation region;

forming a patterned photoresist layer on the first insulation film to cover an edge of one of the element isolation films defining the capacitor formation region and to cover the transistor formation region;

etching the first insulation film using the patterned photoresist layer as a mask to expose the lower electrode layer;

forming a second insulation film on the exposed lower electrode layer so that the second insulation film and the first insulation film covering the edge of the one of the element isolation films form a capacitor insulation film; and forming a gate electrode on the first insulation film of the transistor formation region and an upper electrode layer on the capacitor insulation film.

2. The method of manufacturing the semiconductor device of claim 1, wherein a thickness of the first insulation film is larger than a thickness of the second insulation film.

3. The method of manufacturing the semiconductor device of claim 2, wherein each of the element isolation films comprises a trench isolation film.

4. The method of manufacturing the semiconductor device of claim 1, wherein each of the element isolation films comprises a trench isolation film.

5. A method of manufacturing a semiconductor device comprising a capacitor and three MOS transistors on a front surface of a same semiconductor substrate, the method comprising:

forming element isolation films on the substrate to define a capacitor formation region, a first transistor formation region, a second transistor formation region and a third transistor formation region;

implanting impurity ions into the capacitor formation region to form a lower electrode layer;

forming a first insulation film to cover the element isolation films, the capacitor formation region and the first, second and third transistor formation regions;

forming a patterned photoresist layer on the first insulation film to cover an edge of one of the element isolation films defining the capacitor formation region and to cover the first transistor formation region;

etching the first insulation film using the patterned photoresist layer as a mask to remove the first insulation film from the capacitor formation region and the second and third transistor formation regions;

forming a second insulation film on the capacitor formation region and the second and third transistor formation regions from which the first insulation film is removed;

removing the second insulation film from the third transistor formation region;

forming a third insulation film on the third transistor formation region from which the second insulation film is removed; and forming a first transistor in the first transistor formation region so that the first transistor comprises a gate insulation film comprising the first insulation film and a gate electrode formed on the gate insulation film of the first transistor;

forming a second transistor in the second transistor formation region so that the second transistor comprises a gate insulation film comprising the second insulation film and a gate electrode formed on the gate insulation film of the second transistor;

forming a third transistor in the third transistor formation region so that the third transistor comprises a gate insulation film comprising the third insulation film and a gate electrode formed on the gate insulation film of the third transistor; and forming a capacitor in the capacitor formation region so that the capacitor comprises a capacitor insulation film comprising the second insulation film and an upper electrode layer formed on the capacitor insulation film.

6. The method of manufacturing the semiconductor device of claim 5, wherein a thickness of the first insulation film is larger than a thickness of the second insulation film, and the thickness of the second insulation film is larger than a thickness of the third insulation film.

7. The method of manufacturing the semiconductor device of claim 6, wherein each of the element isolation films comprises a trench isolation film.

8. The method of manufacturing the semiconductor device of claim 5, wherein each of the element isolation films comprises a trench isolation film.

* * * * *